(12) United States Patent
Bahr et al.

(10) Patent No.: US 12,191,554 B2
(45) Date of Patent: Jan. 7, 2025

(54) ACOUSTIC WAVEGUIDE WITH DIFFRACTION GRATING

(71) Applicant: TEXAS INSTRUMENTS INCORPORATED, Dallas, TX (US)

(72) Inventors: Bichoy Bahr, Allen, TX (US); Benjamin Stassen Cook, Los Gatos, CA (US); Scott R. Summerfelt, Garland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 437 days.

(21) Appl. No.: 17/347,365

(22) Filed: Jun. 14, 2021

(65) Prior Publication Data
US 2022/0399628 A1    Dec. 15, 2022

(51) Int. Cl.
| | |
|---|---|
| *H01P 3/12* | (2006.01) |
| *H01L 23/31* | (2006.01) |
| *H01L 25/18* | (2023.01) |
| *H05K 1/18* | (2006.01) |

(52) U.S. Cl.
CPC ............ *H01P 3/12* (2013.01); *H01L 23/3107* (2013.01); *H01L 25/18* (2013.01); *H05K 1/181* (2013.01)

(58) Field of Classification Search
CPC ........ H01P 3/12; H01L 23/3107; H01L 25/18; H01L 23/16; H01L 23/315; H01L 23/3185; H01L 2224/0401; H01L 2224/04042; H01L 2224/04105; H01L 2224/12105; H01L 2224/131; H01L 2224/16227; H01L 2224/48247; H01L 2224/96; H01L 2924/15311; H01L 2924/16235; H01L 2924/1815; H01L 2924/18165; H05K 1/181; H05K 3/3436; H05K 2201/09063; H05K 2201/09072; H05K 2201/10083; H05K 2201/10734
USPC ....................................................... 257/666
See application file for complete search history.

(56) References Cited

U.S. PATENT DOCUMENTS

| | | | |
|---|---|---|---|
| 9,945,818 B2* | 4/2018 | Ganti ................. | G06V 40/1306 |
| 2007/0008767 A1* | 1/2007 | Murakami ............ | H10B 53/30 257/295 |
| 2011/0198968 A1* | 8/2011 | Sato ..................... | A61B 8/4483 310/317 |
| 2015/0295305 A1* | 10/2015 | Herbsommer ........ | H01L 23/495 343/873 |
| 2017/0286731 A1* | 10/2017 | Elsherbini .......... | G06K 19/0672 |

(Continued)

FOREIGN PATENT DOCUMENTS

JP          2007227548 A   *  9/2007    ............. G11C 11/22

*Primary Examiner* — Kimberly N Rizkallah
*Assistant Examiner* — Pratiksha Jayant Lohakare
(74) *Attorney, Agent, or Firm* — Michelle F. Murray; Frank D. Cimino

(57) ABSTRACT

In some examples, a package comprises a semiconductor die having a first surface and a second surface opposing the first surface, the semiconductor die including circuitry formed in the first surface. The package includes an acoustic waveguide in the semiconductor die, the acoustic waveguide including an array of capacitors. The array of capacitors includes a transducer portion and a diffraction grating portion. The transducer portion is configured to convert signals between electrical signals and acoustic waves, and the diffraction grating portion is configured to direct the acoustic waves toward and receive the acoustic waves from the second surface.

20 Claims, 15 Drawing Sheets

(56) References Cited

U.S. PATENT DOCUMENTS

2017/0316243 A1* 11/2017 Ghavanini ......... G06V 40/1382
2018/0164432 A1*  6/2018 Lal .................... G01N 22/00
2020/0219861 A1*  7/2020 Kamgaing ........... H03H 9/0561
2020/0235716 A1*  7/2020 Eid ..................... H01L 23/66
2021/0080906 A1*  3/2021 Jolly ................... G02B 6/005

* cited by examiner

ACOUSTIC WAVEGUIDE WITH DIFFRACTION GRATING

BACKGROUND

Acoustic waves are useful in a variety of applications, including industrial and medical applications. In many such applications, a transducer converts electrical signals to acoustic waves, and the acoustic waves are provided to a target medium (e.g., the human body to view an organ, a semiconductor package to determine structural integrity). The acoustic waves reflect off of features in the target medium and return to the transducer, which converts the acoustic signals to electrical signals. The electrical signals are subsequently processed by appropriate circuitry, such as a processor or microcontroller, to create images of those features.

SUMMARY

In some examples, a package comprises a semiconductor die having a first surface and a second surface opposing the first surface, the semiconductor die including circuitry formed in the first surface. The package includes an acoustic waveguide in the semiconductor die, the acoustic waveguide including an array of capacitors. The array of capacitors includes a transducer portion and a diffraction grating portion. The transducer portion is configured to convert signals between electrical signals and acoustic waves, and the diffraction grating portion is configured to direct the acoustic waves toward and receive the acoustic waves from the second surface.

DETAILED DESCRIPTION

Although low-frequency acoustic wave technologies can be useful for viewing features in a target medium, the resulting images are low-resolution. Thus, low-frequency acoustic wave technologies are less useful for viewing fine, highly detailed features, such as different layers of coatings or paint in industrial applications, the surface integrity of metals, semiconductor device packages, fine features in the human body, Doppler flow meters, microfluidics applications, etc. Because high-frequency acoustic wave technologies (e.g., those implemented using slow-wave structures in complementary metal oxide semiconductor (CMOS) technology) produce short wavelength acoustic waves, they enable high-resolution imaging in the applications described above. However, implementing high-frequency acoustic wave technology in semiconductor packages is challenging. An ultrasonic transducer providing the acoustic waves should be in contact with the application medium. Packaging materials, bondwires, and active circuitry can all be positioned in the way of wave propagation, creating unnecessary reflections, dispersion, and losses that can significantly limit the range of wave propagation. Consequently, the high-frequency acoustic waves are often unable to reach the target media that is to be imaged.

This description provides various examples of a semiconductor package including an acoustic waveguide having a diffraction grating. The acoustic waveguide is positioned inside the body of a semiconductor die, which has an active surface including and/or coupled to the high-attenuation materials described above and a non-active surface approximately parallel to and opposing the active surface. The waveguide is oriented approximately parallel to the active and non-active surfaces, referred to hereinafter as the horizontal direction. An ultrasonic transducer forms part of the horizontal waveguide, thus enabling the provision and/or detection of acoustic waves inside the waveguide. The diffraction grating is configured to direct the high-frequency acoustic waves from the horizontal waveguide in a vertical direction toward the non-active surface. The ultrasonic waves may become normally incident on the non-active surface of the die. The semiconductor die (e.g., single crystalline silicon) is a low-attenuation material, meaning that the acoustic waves may propagate for 300 to 400 microns before experiencing attenuation. In this way, the high-frequency acoustic waves are able to propagate through the semiconductor die, through the non-active surface, and into the target medium that is to be imaged. Similarly, the acoustic waveguide may receive reflected acoustic waves through the non-active surface and through the low-attenuation semiconductor die. Examples of the semiconductor package are now described with reference to FIGS. 1-9.

Figure 1:
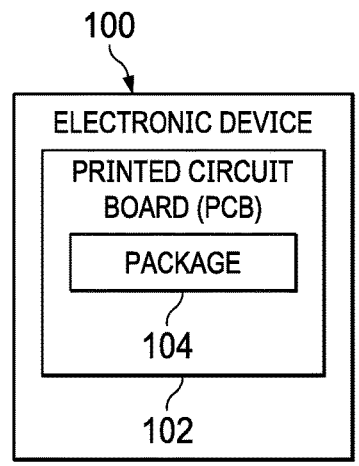
FIG. 1 is a block diagram of an electronic device including a semiconductor package in various examples.

FIG. 1 is a block diagram of an electronic device including a semiconductor package in various examples. Specifically, FIG. 1 is a block diagram of an electronic device 100, such as a medical ultrasound machine, a flowmeter, a metal or paint analysis device, a surface acoustic microscopy device, or any other electronic device configured to apply ultrasound technology to provide high-resolution images of fine, high-detail features in a target medium. In examples, the electronic device 100 contains one or more components fabricated using CMOS technology. The electronic device 100 may include a printed circuit board (PCB) 102 and a semiconductor package 104 coupled to the PCB 102. The package 104 may be any suitable type of package, including a dual inline package (DIP) having gullwing or other suitably-formed leads, a quad flat no lead (QFN) package, a wirebond package, a flip-chip package, etc. As described below, the semiconductor package 104 includes a semiconductor die (e.g., a single crystalline silicon die) that includes an acoustic waveguide in the semiconductor die body (e.g., oriented horizontally, approximately parallel to the semiconductor die active surface). The acoustic waveguide includes a diffraction grating that is configured to direct acoustic waves in a vertical direction toward and receive normally incident acoustic waves from a non-active surface opposing an active surface of the semiconductor die. In this manner, acoustic waves are able to propagate to and from the acoustic waveguide with little or no attenuation.

Figure 2A:
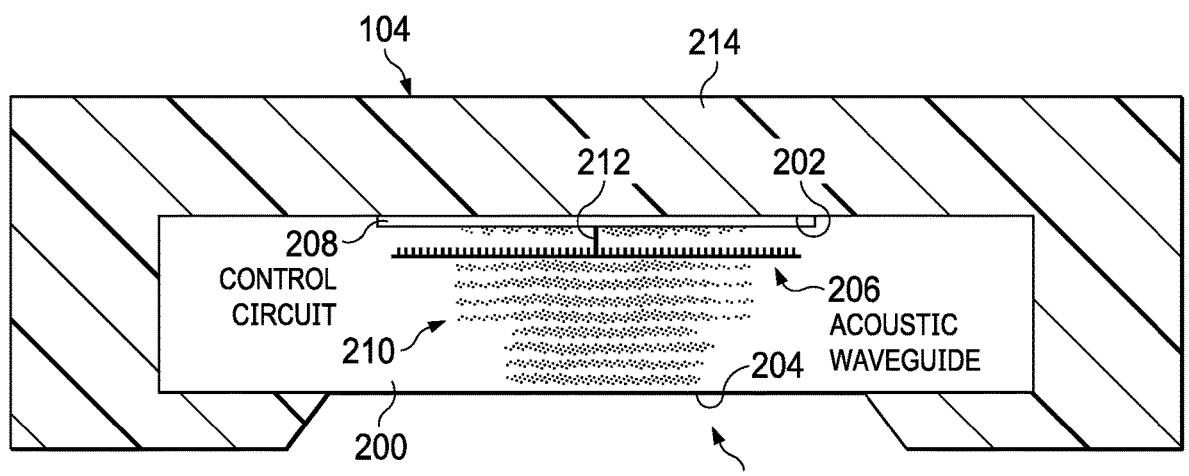
FIGS. 2A, 2B, and 2C are profile cross-sectional, bottom-up, and perspective views, respectively, of a semiconductor package including an acoustic waveguide with a diffraction grating in various examples.

FIG. 2A is a profile cross-sectional view of a semiconductor package including an acoustic waveguide with a diffraction grating in various examples. In particular, FIG. 2A is a profile cross-sectional view of an example of the semiconductor package 104 (FIG. 1). The semiconductor package 104 may include a semiconductor die 200, such as a single crystalline silicon die or a die formed of a semiconductor material with similar, low-attenuation properties. The semiconductor die 200 includes an active surface 202 in and/or on which various circuitry may be formed. The semiconductor die 200 also includes a non-active surface 204 that opposes and that is approximately parallel to the active surface 202. Although the semiconductor die 200 may include multiple non-active surfaces, the term "non-active surface," as used herein, refers to the non-active surface 204. The semiconductor die 200 also may include an acoustic waveguide 206 in the body of the semiconductor die 200. For example, the acoustic waveguide 206 may be positioned between the active surface 202 and the non-active surface 204. As described above, high-frequency acoustic waves (e.g., 400-1000 Mega Hertz (MHz)) may propagate through 300-400 microns of semiconductor dies (e.g., single crystalline silicon) with little-to-no attenuation. Accordingly, in examples, a distance between the acoustic waveguide 206 and the non-active surface 204 does not exceed 400 microns. In some examples, a relatively small degree of attenuation may result in an acoustic wave that is still useful, and in some such examples, the distance between the acoustic waveguide 206 and the non-active surface 204 does not exceed 500 microns. In some examples, a relatively strong signal may be produced with a distance between the acoustic waveguide 206 and the non-active surface 204 of less than 300 microns.

The semiconductor package 104 may include a control circuit 208 formed in and/or on the active surface 202. The control circuit 208 may be a processor, microcontroller, or any other analog and/or digital circuit that is configured to operate and control the transducer in the acoustic waveguide 206. For example, the control circuit 208 is configured to provide electrical signals to a transducer(s) in the acoustic waveguide 206 that may provide acoustic waves according to the electrical signals. For example, the control circuit 208 is configured to receive and process electrical signals from the transducer(s) in the acoustic waveguide 206 that may provide electrical signals according to reflected and received acoustic waves. Example high-frequency acoustic waves 210 propagate through the semiconductor die 200 to and from the acoustic waveguide 206. One or more connectors 212 are coupled to the acoustic waveguide 206 and to the control circuit 208. The control circuit 208 and the acoustic waveguide 206 are configured to communicate via the one or more connectors 212. A mold compound 214 covers the semiconductor die 200. The mold compound 214 includes a cavity 216 through which the non-active surface 204 is exposed to an environment of the semiconductor package 104.

Figure 2B:
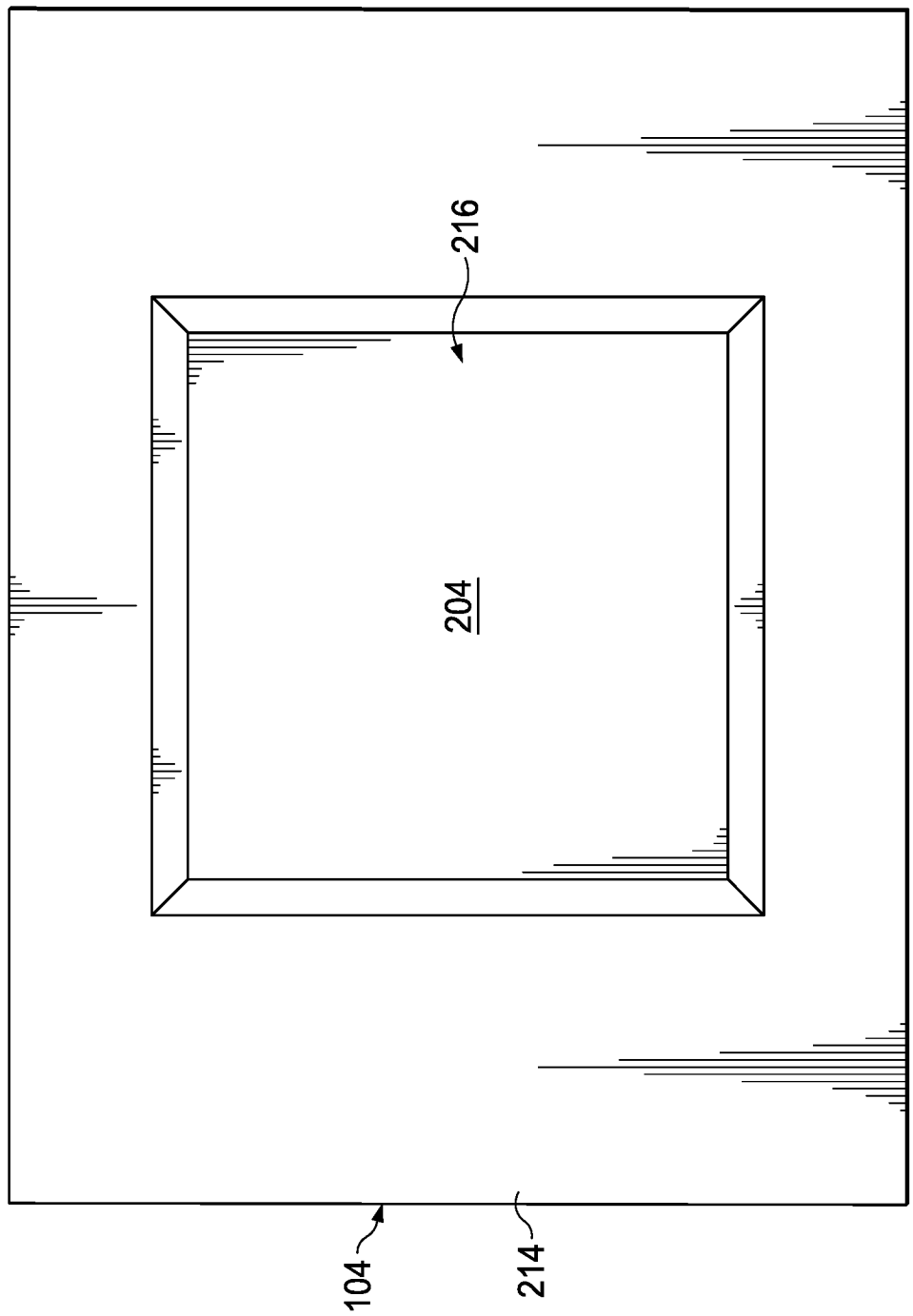
Figure 2C:
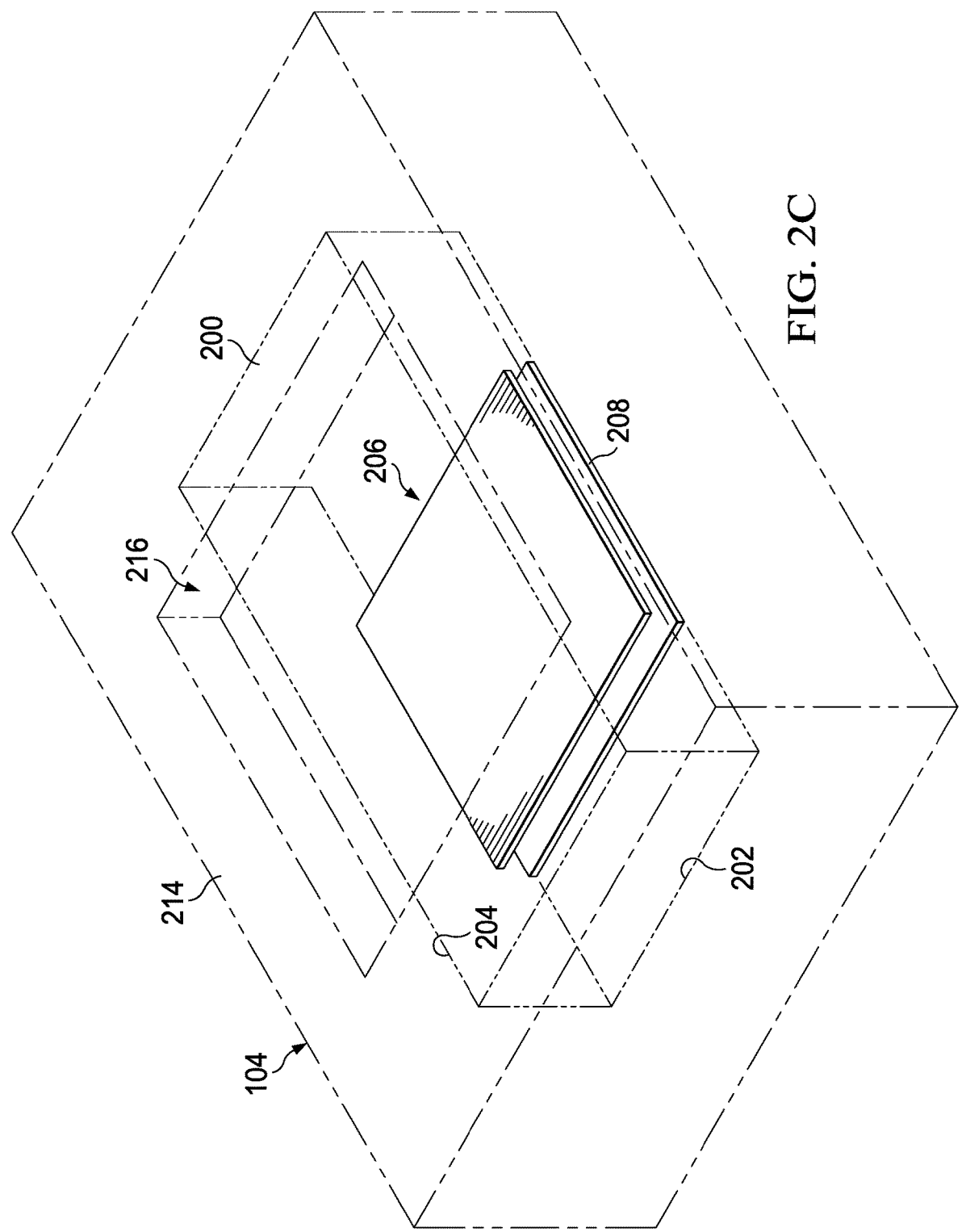

FIG. 2B is a bottom-up view of the semiconductor package 104. FIG. 2C is a perspective view of the semiconductor package 104.

Figure 3A:
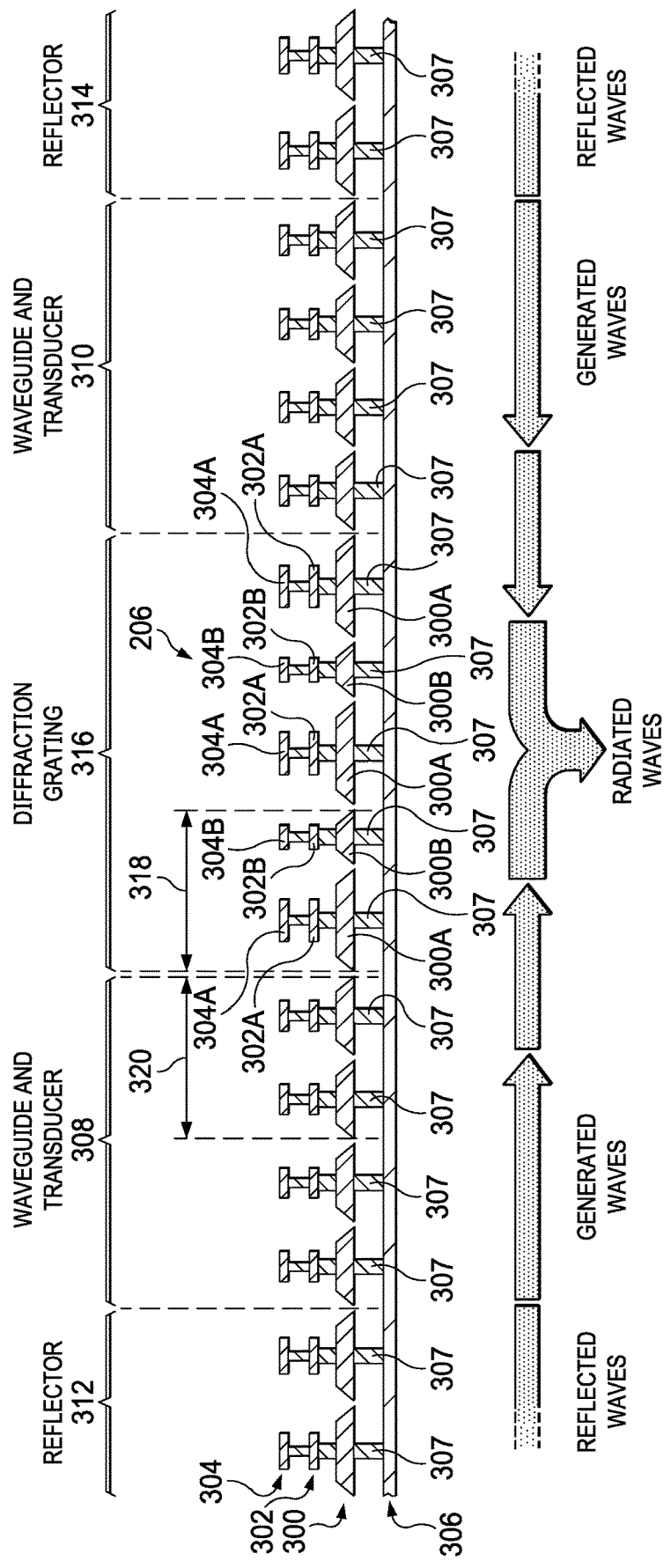
FIG. 3A is a profile cross-sectional view of an acoustic waveguide with a diffraction grating in various examples.

FIG. 3A is a profile cross-sectional view of an acoustic waveguide with a diffraction grating in various examples. More specifically, FIG. 3A is a profile cross-sectional view of an example of the acoustic waveguide 206 (FIG. 2A). The acoustic waveguide 206 includes an array of capacitors 300 (e.g., ferroelectric, piezoelectric capacitors that are configured to provide, responsive to the application of electrical signals, stress and strain that results in acoustic waves). The example acoustic waveguide 206 also includes an array of metal contacts 302, which are adapted to be coupled to a metal layer (e.g., MET 1) in circuitry formed in and/or on the active surface 202 (FIG. 2A). The example acoustic waveguide 206 also includes an array of metal contacts 304, which are adapted to be coupled to a metal layer (e.g., MET 2) in circuitry formed in and/or on the active surface 202 (FIG. 2A). Other metal layers may be included in some examples. The example acoustic waveguide 206 also includes a poly contact 306 adapted to be coupled to a poly layer of the semiconductor die 200 (FIG. 2A). Although a single poly contact 306 (e.g., a poly runner) is shown, in some examples, individual poly contacts 306 (e.g., one poly contact 306 for each capacitor 300) also may be useful to couple to the poly layer. The example acoustic waveguide 206 includes multiple vias 307. Some of the vias 307 are adapted to be coupled to a top plate of a respective capacitor 300 and metal contacts 302 and/or 304. Some of the vias 307 are adapted to be coupled to a bottom plate of a respective capacitor 300 and the poly contact 306.

The array of capacitors 300 is configured to guide acoustic waves in specific directions. For example, the array of capacitors 300 may be configured to cause acoustic waves to resonate horizontally along the array of capacitors 300. The acoustic waves do not escape the array of capacitors 300 in the horizontal direction.

The array of capacitors 300 includes differing portions, and each portion is configured to perform various functions. In the example of FIG. 3A, the array of capacitors 300 includes a waveguide and transducer portion 308, a waveguide and transducer portion 310, a reflector portion 312, a reflector portion 314, and a diffraction grating portion 316. In examples, from left to right, the different portions are arranged as follows: the reflector portion 312, the waveguide and transducer portion 308, the diffraction grating portion 316, the waveguide and transducer portion 310, and the reflector portion 314. Stated another way, in examples, the diffraction grating portion 316 is positioned between the waveguide and transducer portions 308 and 310. The waveguide and transducer portion 308, in turn, is positioned between the diffraction grating portion 316 and the reflector portion 312. The waveguide transducer portion 310 is positioned between the diffraction grating portion 316 and the reflector portion 314.

Each of these portions 308, 310, 312, 314, and 316 has capacitors 300 with different structural properties (e.g., differing capacitor 300 dimensions), resulting in different functional features. The differing functional features result because the differing portions 308, 310, 312, 314, and 316 have different high and low cutoff frequencies that depend on the dimensions of the capacitors 300 in those portions. For instance, a portion having an approximately uniform capacitor size x may enable acoustic waves in a specific frequency band to propagate through that portion, but a portion having a larger, approximately uniform capacitor size y may have different cutoff frequencies and thus may reject (e.g., reflect) those same acoustic waves. Thus, adjusting the capacitor 300 dimensions causes changes in the frequency band of acoustic waves permitted to propagate through a particular portion, thereby causing different behaviors among the various portions of the array of capacitors 300.

For example, the capacitors 300 in the reflector portions 312 and 314 are have larger dimensions than the capacitors 300 in other portions of the array of capacitors 300. As a result of these increased dimensions, the reflector portions 312 and 314 are configured to reflect (e.g., reject) acoustic waves back in the direction from which the acoustic waves approached the reflector portions 312. For instance, an acoustic wave propagating from the waveguide and transducer portion 308 toward the reflector portion 312 will be reflected by the reflector portion 312 so the acoustic wave returns to the waveguide and transducer portion 308. The reflector portion 314 is configured to behave similarly.

The waveguide and transducer portions 308 and 310 are configured to provide acoustic waves responsive to electrical signals received from the control circuit 208 (FIG. 2A). The waveguide and transducer portions 308 and 310 are configured to provide electrical signals responsive to acoustic waves received via the acoustic waveguide 206. In both situations, the waveguide and transducer portions 308, 310 operate as waveguides, except that at least some of the capacitors 300 in the waveguide and transducer portions 308, 310 are driven and/or sensed by the control circuit 208. The capacitors 300 that are not driven and/or sensed by the control circuit 208 are either coupled to ground, are biased to a fixed voltage, or are left floating. In examples, the waveguide and transducer portions 308 and 310 have capacitor 300 dimensions that are smaller than those of the capacitors 300 in the reflector portions 312 and 314. Thus, acoustic waves reflected by the reflector portions 312 and 314 may propagate through the waveguide and transducer portions 308 and 310.

Figure 3B:
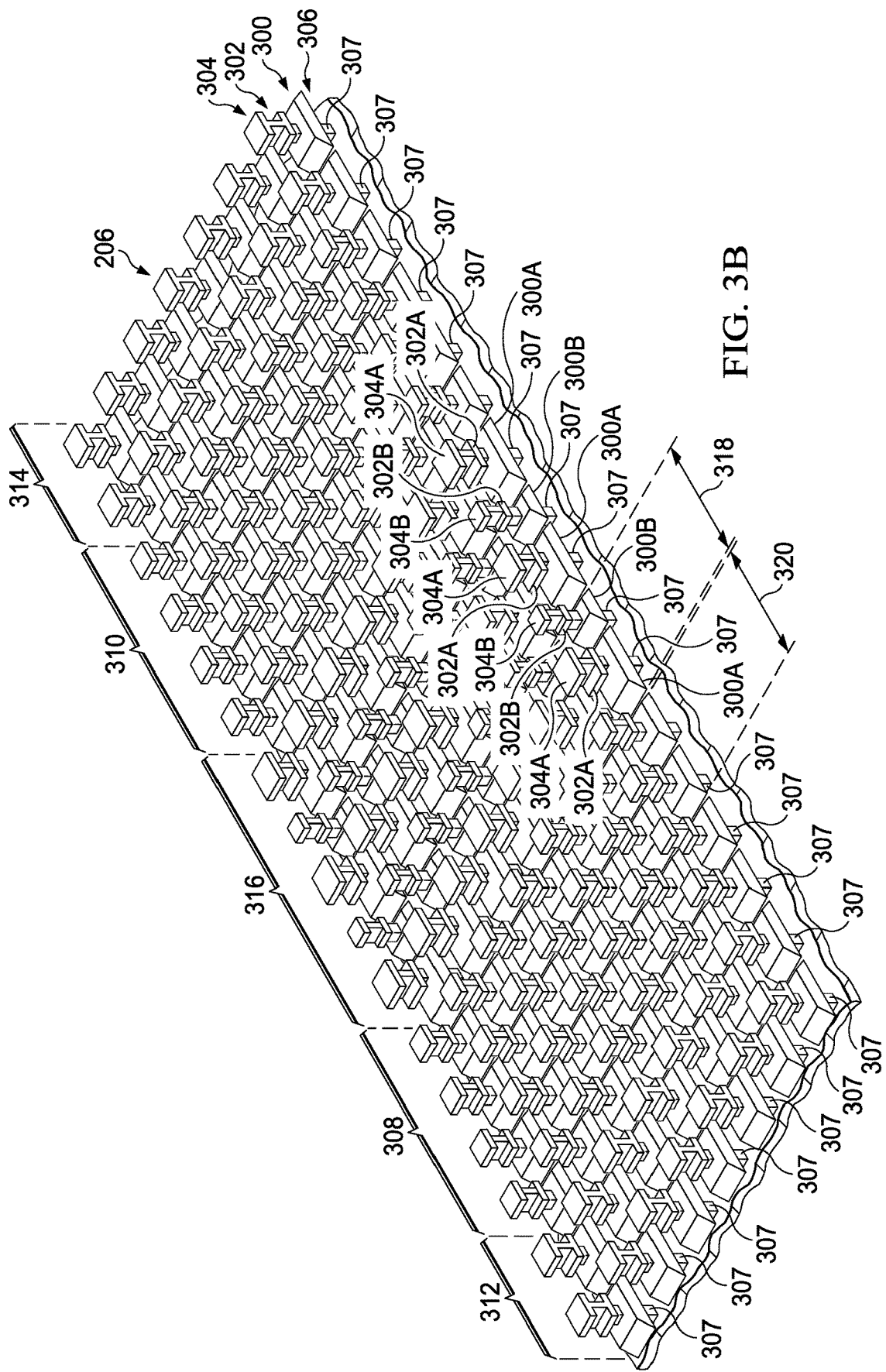
FIG. 3B is a perspective view of an acoustic waveguide with a diffraction grating in various examples.

The diffraction grating portion 316 includes capacitors 300, metal contacts 302, and/or metal contacts 304 that differ from the capacitors 300, metal contacts 302, and/or metal contacts 304 in other portions 308, 310, 312, and 314. Specifically, the diffraction grating portion 316 includes one or more perturbations, or abrupt deviations from the structural features of the other portions 308, 310, 312, and 314, that cause acoustic waves propagating through the diffraction grating portion 316 to be radiated in different directions. For example, the diffraction grating portion 316 may include capacitors 300A that have larger dimensions than those of the remaining capacitors in the array of capacitors 300. The diffraction grating portion 316 also may include capacitors 300B that have smaller dimensions than those of the remaining capacitors in the array of capacitors 300. In the example of FIG. 3A, the large and small capacitors 300A and 300B are provided in an alternating pattern. This irregularity or perturbation in capacitor dimensions causes the acoustic waves propagating through the diffraction grating portion 316 to be directionally radiated. The precise direction (e.g., angle) at which the acoustic waves are radiated may depend on the period or wavelength of the acoustic wave and the irregularity or perturbation implemented. In one example, the direction at which the acoustic waves are radiated may depend on the number of capacitors 300 that corresponds to each wavelength of the acoustic wave. For example, a distance 318 is the sum of the lengths of the capacitors 300A, 300B as FIG. 3A shows, and a distance 320 is the sum of the lengths of two capacitors 300 in the waveguide and transducer portion 308. Responsive to the distances 318 and 320 being approximately equal and the dimensions of the capacitors 300A, 300B differing from each other and from the dimensions of the remaining capacitors 300, the acoustic waves are radiated at an approximately 90 degree angle (e.g., orthogonal to the array of capacitors 300). In some examples, the specific angle at which the acoustic waves are radiated may be adjusted by adjusting the number of capacitors 300 per wavelength of the acoustic wave. Perturbations causing radiation of acoustic waves also may include irregularities in the sizes of the metal contacts 302A, 302B and 304A, 304B. FIG. 3B is a perspective view of the acoustic waveguide 206.

In some examples, each of the capacitors 300 in the waveguide and transducer portions 308 and 310 has a horizontal area ranging from 2 microns$^2$ to 200 microns$^2$. Horizontal areas exceeding this range may cause substantially low frequency operation and the acoustic wave may no longer be controlled by the periodicity of the capacitors 300. Horizontal areas below this range may result in substantially short periodicity that is not suitable for fabrication. In some examples, each of the capacitors 300 in the waveguide and transducer portions 308 and 310 has a capacitance ranging from 0.1 pico Farads (pF) to 10 pF.

In some examples, each of the capacitors 300 in the reflector portions 312 and 314 has a horizontal area that is from 105% to 200% of a horizontal area of the capacitors 300 in the waveguide and transducer portions 308 and 310. A capacitor horizontal area difference between the reflector portions 312, 314 and the waveguide and transducer portions 308, 310 that is greater than this range may cause acoustic wave scattering, which lowers operation efficiency. Conversely, a horizontal area difference smaller than this range may cause inadequate acoustic wave reflection, causing losses and inefficiency.

In some examples, each of the capacitors 300 in the diffraction grating portion 316 has a horizontal area that is from 105% to 200% of a horizontal area of the capacitors 300 in the waveguide and transducer portions 308 and 310. Variations in horizontal areas may create perturbations, as described above, to cause acoustic wave diffraction. Specific perturbations may result in specific angles of diffraction, as also described above. Capacitor horizontal areas greater or less than the range above may be suitable in some examples, but they may also result in inappropriate diffraction, depending on the application.

Figure 4:
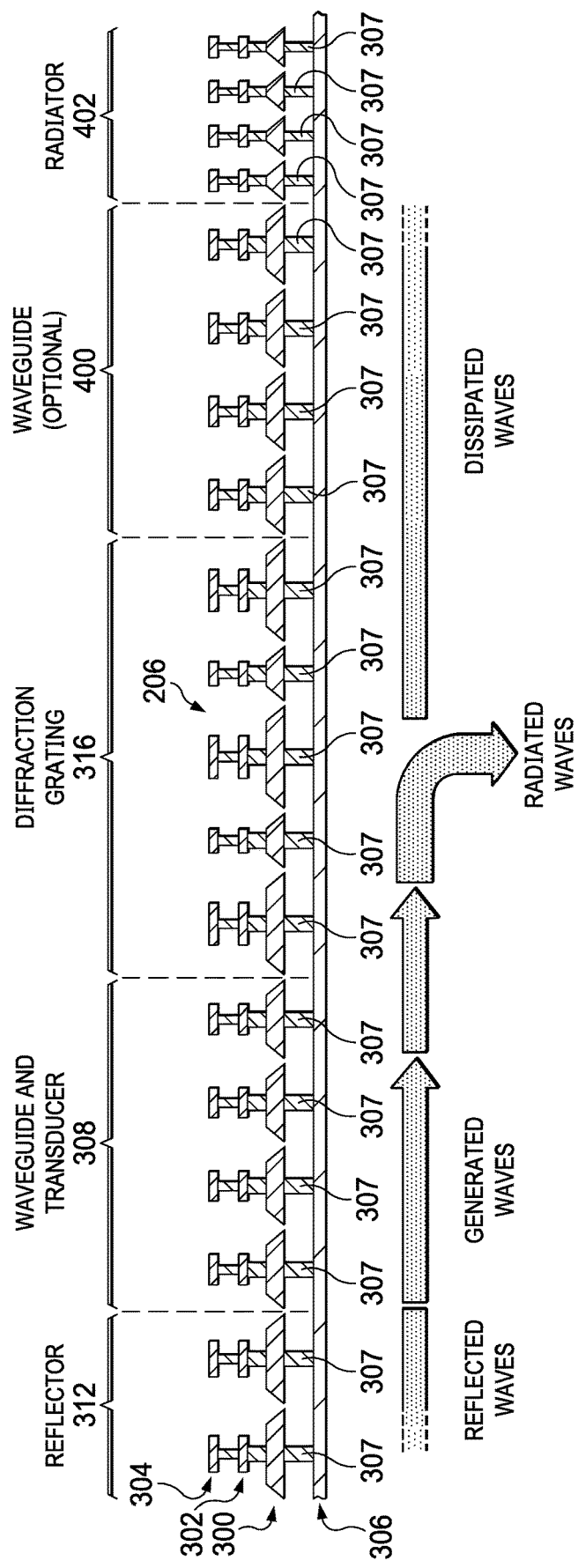
FIG. 4 is a profile cross-sectional view of an acoustic waveguide with a diffraction grating in various examples.

FIG. 4 is a profile cross-sectional view of an acoustic waveguide with a diffraction grating in various examples. Specifically, FIG. 4 is a profile cross-sectional view of another example of an acoustic waveguide 206. The acoustic waveguide 206 of FIG. 4 is virtually identical to the acoustic waveguide 206 of FIGS. 3A and 3B, except that the waveguide and transducer portion 310 is replaced by a waveguide portion 400, and the reflector portion 314 is replaced by a radiator portion 402. The reflector portion 314 is not configured to convert between acoustic waves and electrical signals, but it is configured to permit acoustic waves to propagate through the reflector portion 314. The radiator portion 402 is configured to permit acoustic waves to be emitted from the radiator portion 402. For example, the radiator portion 402 includes capacitors 300 with relatively small dimensions, metal contacts 302 with relatively small dimensions, and metal contacts 304 with relatively small dimensions. As a result of these reduced dimensions relative to the dimensions of the other capacitors 300, metal contacts 302, and metal contacts 304, the radiator portion 402 is configured to allow acoustic waves to propagate through the radiator portion 402 and out the right side of the radiator portion 402. The example of FIG. 4 may be useful in applications where process (e.g., manufacturing) mismatches between components make realization of the example of FIGS. 3A and 3B difficult to implement (e.g., mismatches between the reflector portions 312 and 314 may cause reflections at different phases, resulting in diffraction angles that differ from target diffraction angles).

Figure 5:
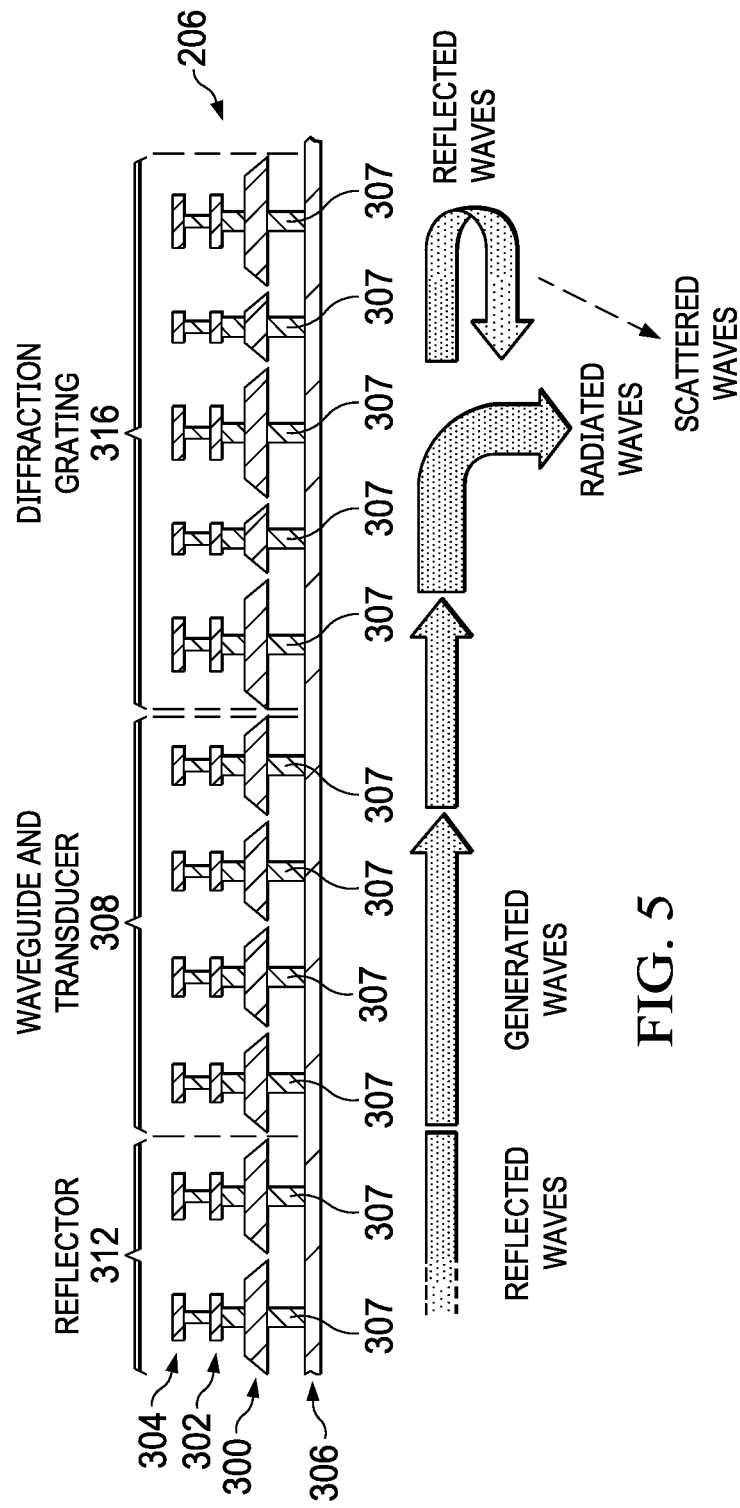
FIG. 5 is a profile cross-sectional view of an acoustic waveguide with a diffraction grating in various examples.

FIG. 5 is a profile cross-sectional view of an acoustic waveguide 206 with a diffraction grating in various examples. The example acoustic waveguide 206 of FIG. 5 is virtually identical to that of FIGS. 3A and 3B, except that the acoustic waveguide 206 of FIG. 5 omits the waveguide and transducer portion 310 and the reflector portion 314. Accordingly, acoustic waves propagating through the acoustic waveguide 206 enter the diffraction grating portion 316, which is configured to radiate some of the acoustic waves in a specific direction, scatter some of the acoustic waves in a non-specific direction, and reflect some of the acoustic waves along the acoustic waveguide 206.

Figure 6A:
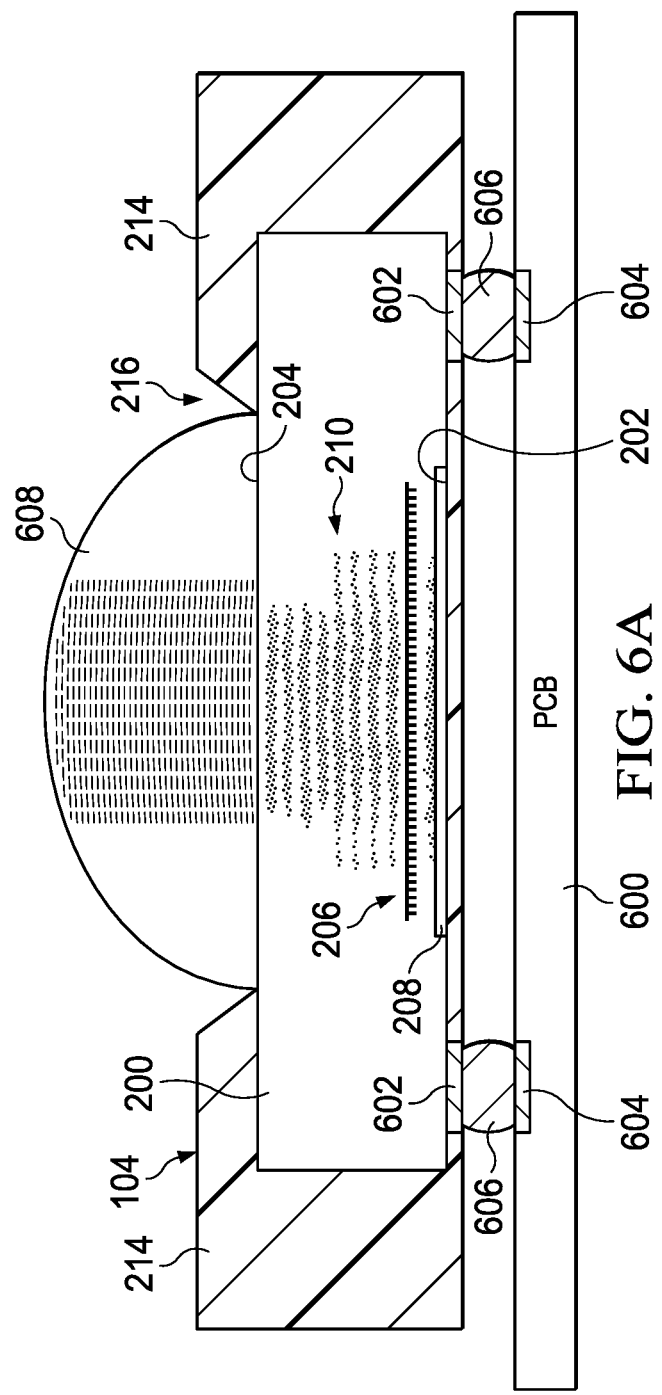
FIGS. 6A, 6B and 6C are profile cross-sectional, top-down, and perspective views, respectively, of a semiconductor package including an acoustic waveguide with a diffraction grating in various examples.

FIG. 6A is a profile cross-sectional view of a semiconductor package 104 including an acoustic waveguide with a diffraction grating in various examples. In examples, the semiconductor package 104 is identical to that shown in FIG. 2A and described above. The semiconductor package 104 is coupled to a printed circuit board (PCB) 600. The semiconductor package 104 may include a redistribution layer (RDL) having metal layers 602 (the remaining portions of the RDL are not expressly shown). The PCB 600 includes bond pads 604. The semiconductor package 104 is coupled to the PCB 600 in a flip-chip configuration. Specifically, the metal layers 602 are coupled to respective bond pads 604 via solder balls 606.

In operation, a control circuit (e.g., control circuit 208 in FIG. 2A) in the semiconductor package 104 provides electrical signals to the acoustic waveguide 206 to drive the acoustic transducer, launching waves in the waveguide 206. For example, the acoustic waveguide 206 may be any of the acoustic waveguides 206 shown in FIG. 3A, 3B, 4 or 5, and the control circuit may provide electrical signals to drive a waveguide and transducer portion (e.g., waveguide and transducer portion(s) 308, 310 in FIG. 3A). Responsive to such electrical signals, the waveguide and transducer portion may provide an acoustic wave that resonates along the acoustic waveguide 206. A diffraction grating portion (e.g., diffraction grating portion 316 in FIG. 3A) of the acoustic waveguide 206 may radiate the acoustic waves in a vertical direction, such as toward the non-active surface 204. A target medium 608 (e.g., water) may receive the radiated acoustic waves through the cavity 216 in the mold compound 214. Acoustic waves are reflected by the target medium 608 and provided to the diffraction grating portion of the acoustic waveguide 206. The acoustic waves propagate along the acoustic waveguide 206 until they are received and converted to electrical signals by the waveguide and transducer portion(s) of the acoustic waveguide 206. The electrical signals are provided to the control circuit. The control circuit may communicate with circuitry on the PCB 600 as appropriate.

In examples, the cavity 216 in the mold compound 214 has a horizontal cross-sectional area sufficiently large so acoustic waves are able to pass through, but not so large that components within the semiconductor package 104 are exposed to undue risk of damage from environmental exposure. Accordingly, in some examples, the horizontal cross-sectional area of the cavity 216 ranges from 10 microns to 1000 microns.

Figure 6B:
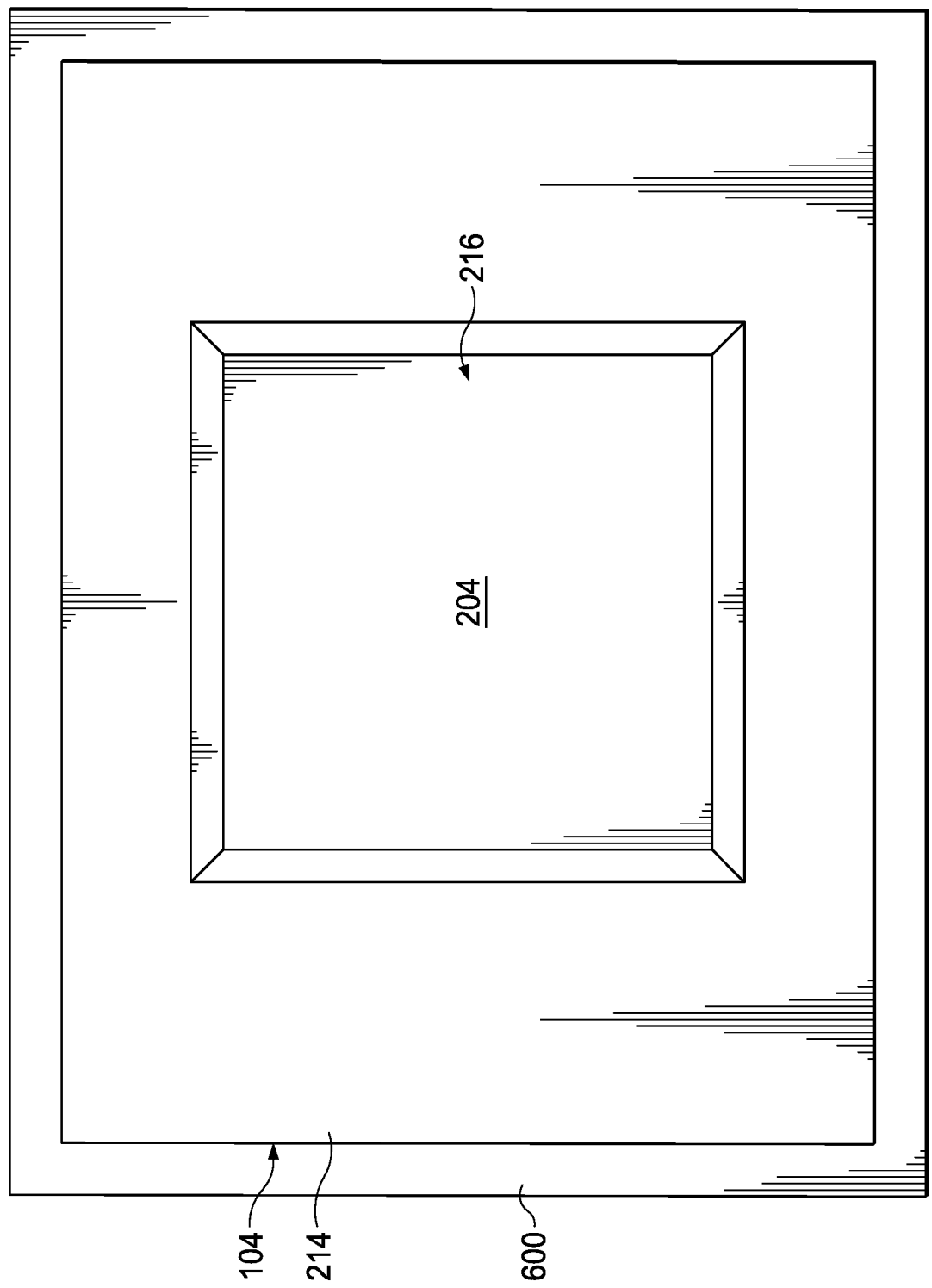
Figure 6C:
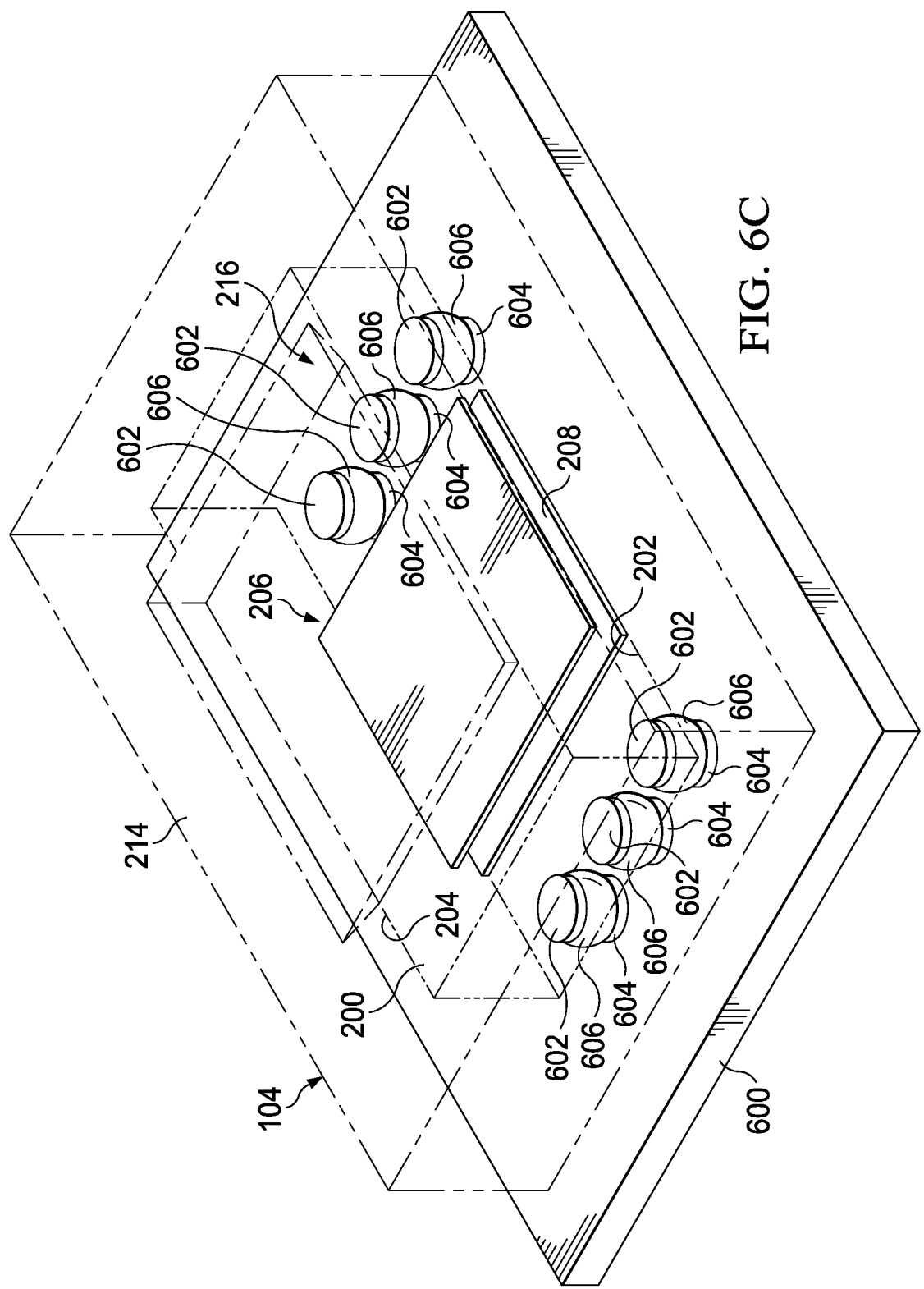

FIG. 6B is a top-down view of the semiconductor package 104. FIG. 6C is a perspective view of the semiconductor package 104.

Figure 7A:
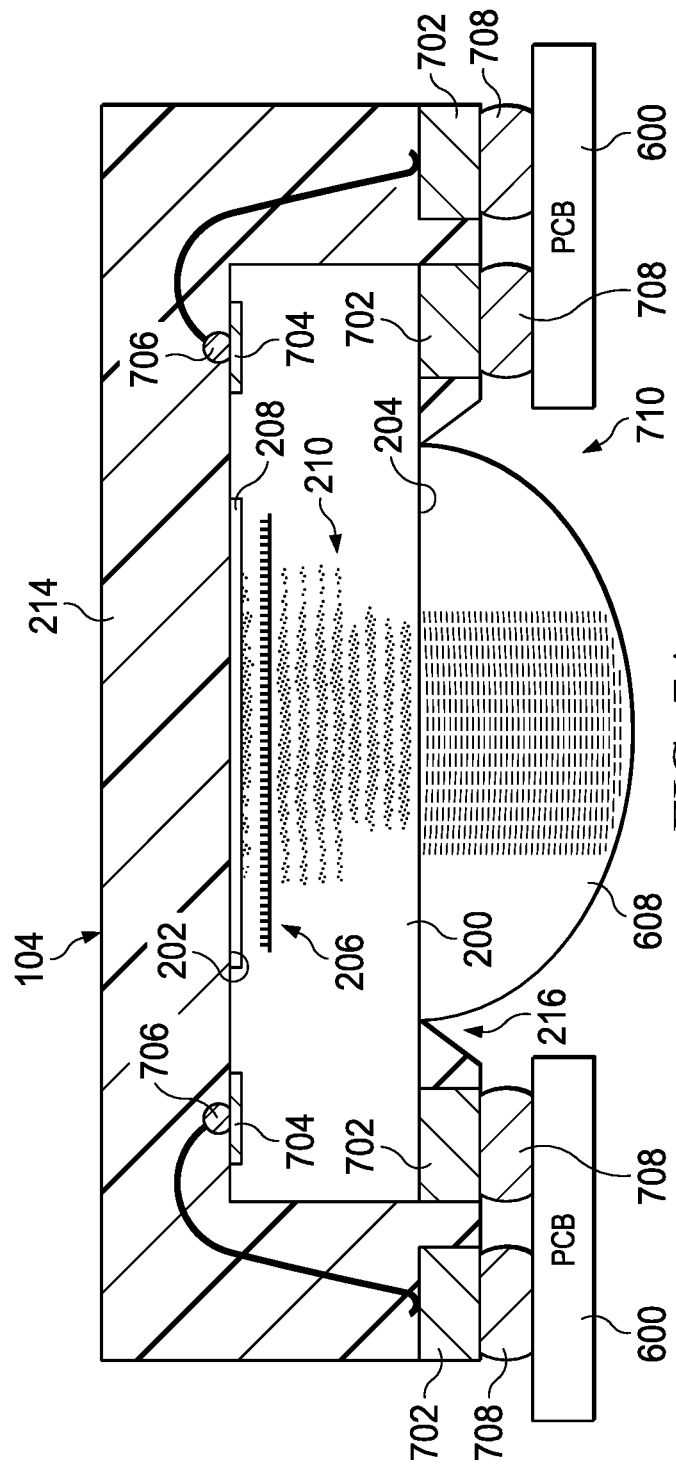
FIGS. 7A, 7B and 7C are profile cross-sectional, bottom-up, and perspective views, respectively, of a semiconductor package including an acoustic waveguide with a diffraction grating in various examples.

FIG. 7A is a profile cross-sectional view of a semiconductor package 104 including an acoustic waveguide with a diffraction grating in various examples. The example semiconductor package 104 of FIG. 7A is a wirebonded QFN package. Specifically, the example semiconductor package 104 includes conductive terminals 702, bond pads 704 on the active surface 202, bond wires 706 coupled to the conductive terminals 702 and bond pads 704. The conductive terminals 702 are coupled to the PCB 600 via solder balls 708. An orifice 710 is present in the PCB 600. The operation of the semiconductor package 104 of FIG. 7A is virtually identical to that of FIG. 6A, except that acoustic waves pass through the orifice 710 of the PCB 600. Also, a control circuit (e.g., control circuit 208 of FIG. 2A) may communicate with circuitry on the PCB 600 via the bond wires 706, the conductive terminals 702, and the solder balls 708.

Figure 7B:
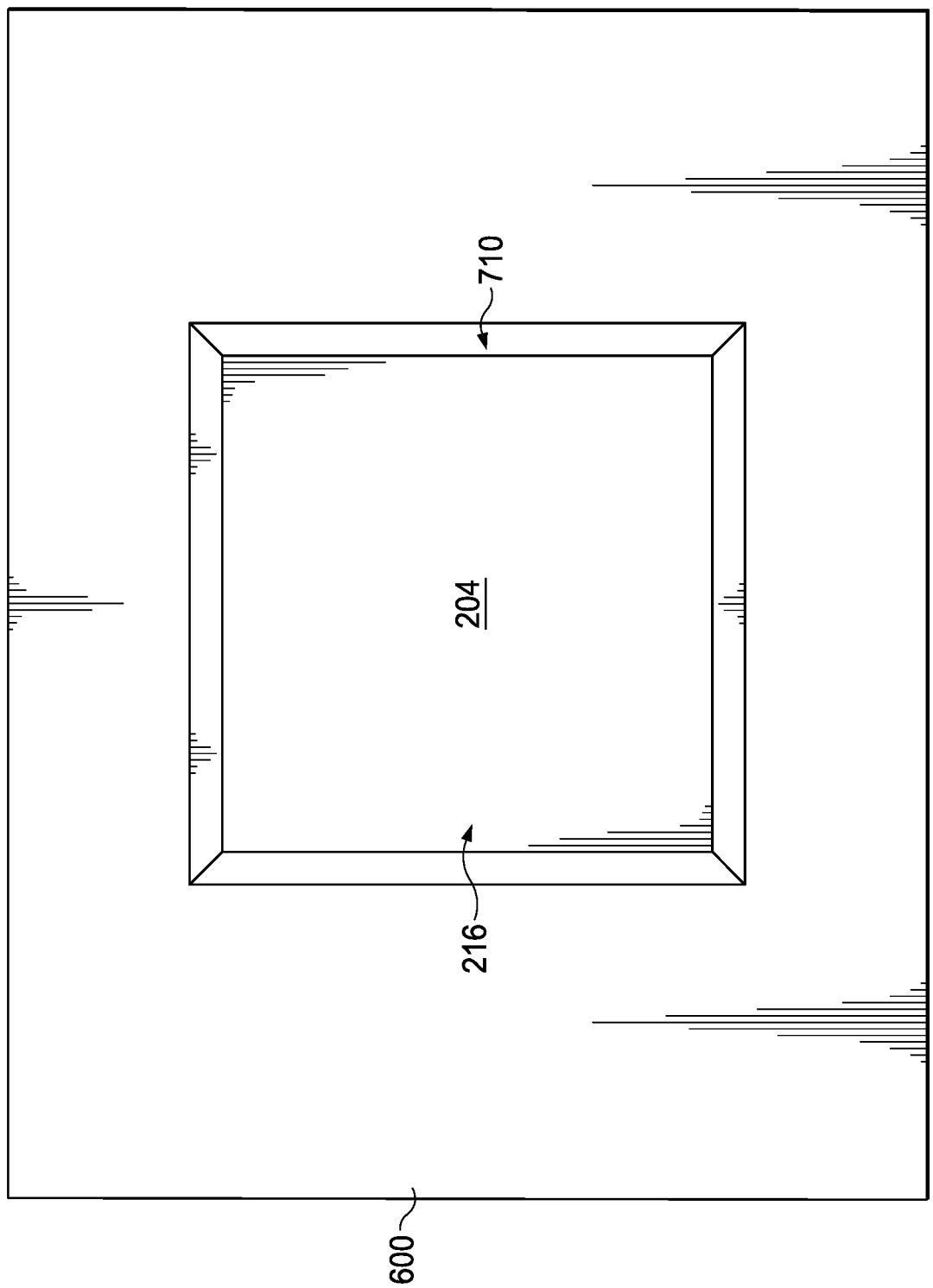
Figure 7C:
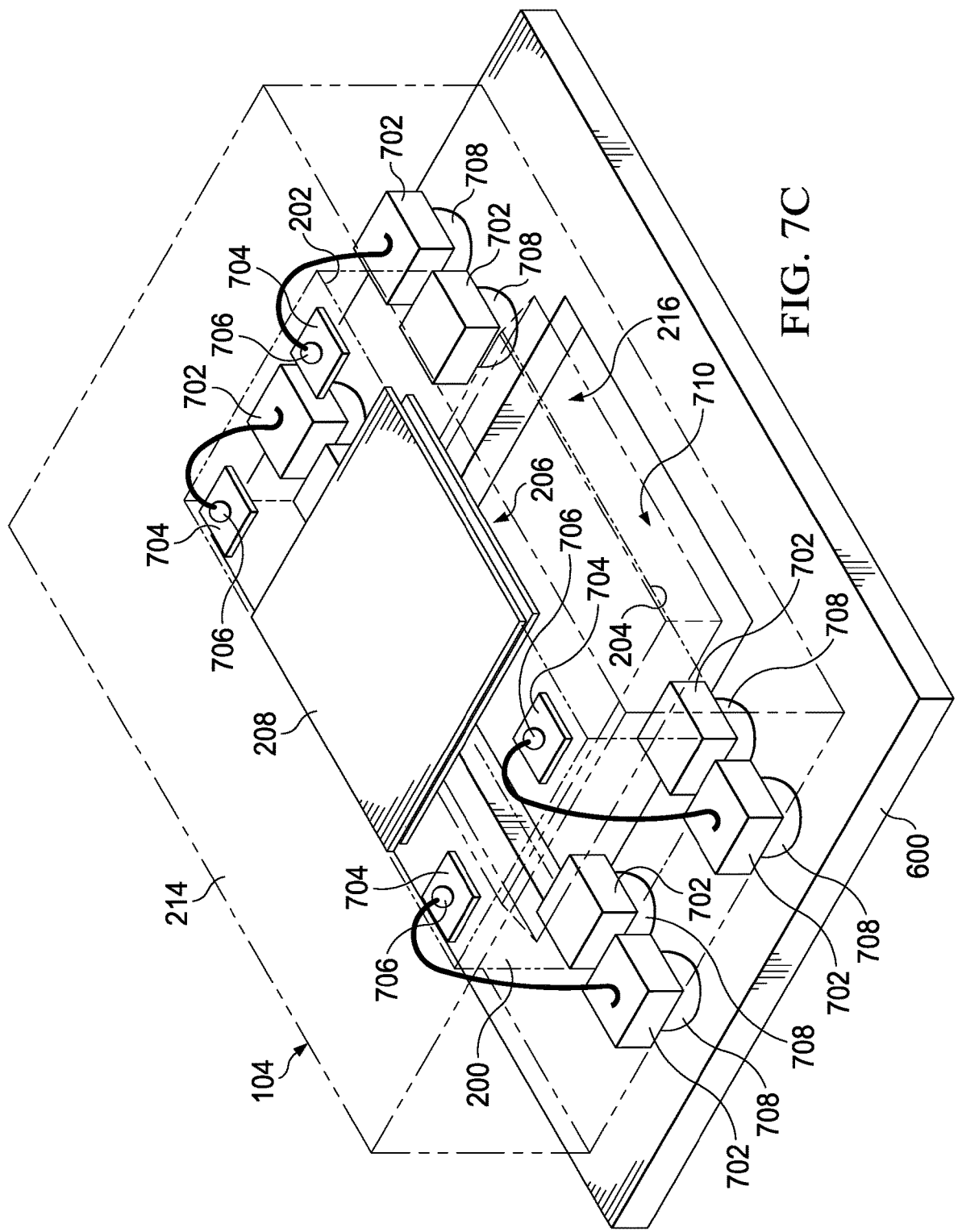

FIG. 7B is a bottom-up view of the semiconductor package 104. FIG. 7C is a perspective view of the semiconductor package 104.

Figure 8:
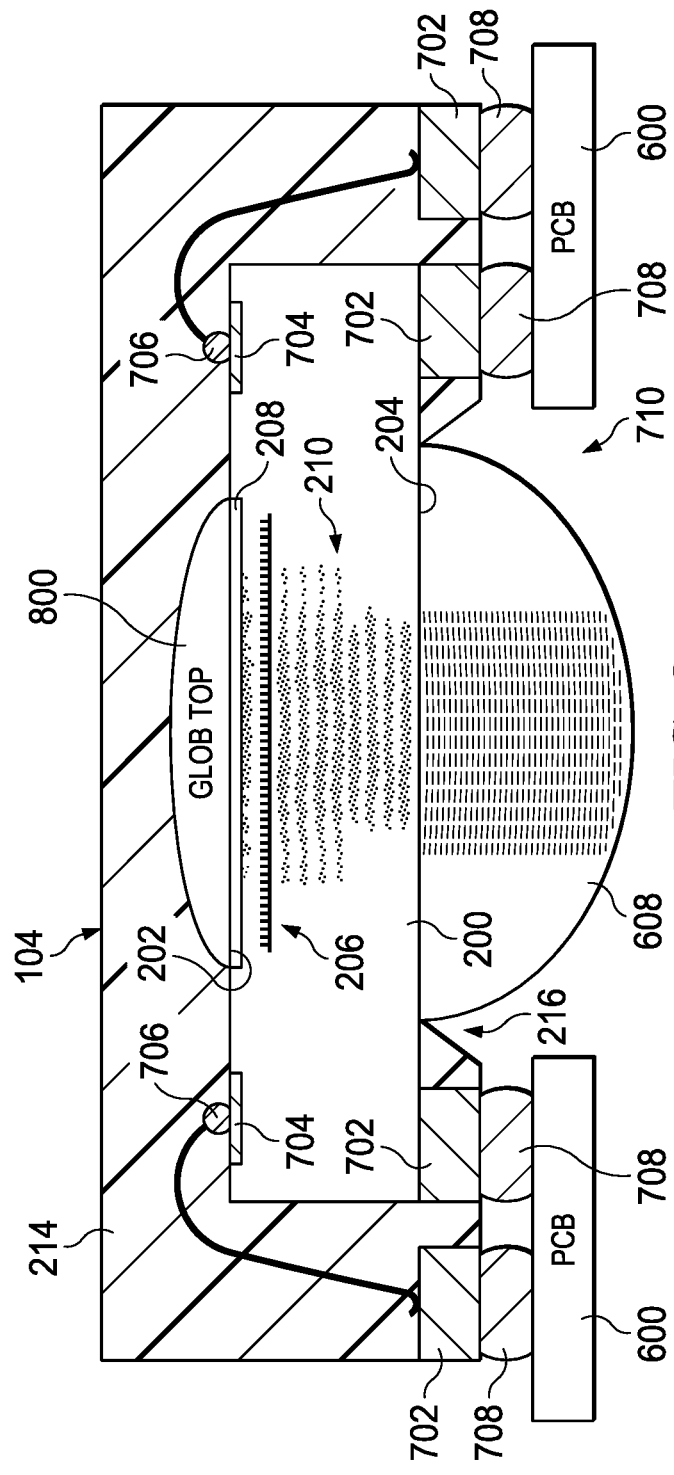
FIG. 8 is a profile cross-sectional view of a semiconductor package including an acoustic waveguide with a diffraction grating in various examples.

FIG. 8 is a profile cross-sectional view of a semiconductor package 104 including an acoustic waveguide with a diffraction grating in various examples. The example semiconductor package 104 of FIG. 8 is identical to that of FIG. 7A, except that the semiconductor package 104 of FIG. 8 includes a glob top 800 positioned on the active surface 202. The glob top 800 prevents acoustic waves radiated by the diffraction grating of the acoustic waveguide 206 from propagating through the mold compound 214. Rather, the acoustic waves propagate toward the cavity 216 and orifice 710. In examples, the glob top 800 has a vertical thickness that is sufficiently large to prevent acoustic wave penetration, but that is not so large as to unduly increase package size and/or costs. Accordingly, in some examples, the glob top 800 has a vertical thickness ranging from 50 microns to 300 microns. The bottom-up and perspective views of FIGS. 7B and 7C are also bottom-up and perspective views, respectively, of the structure in FIG. 8.

Figure 9:
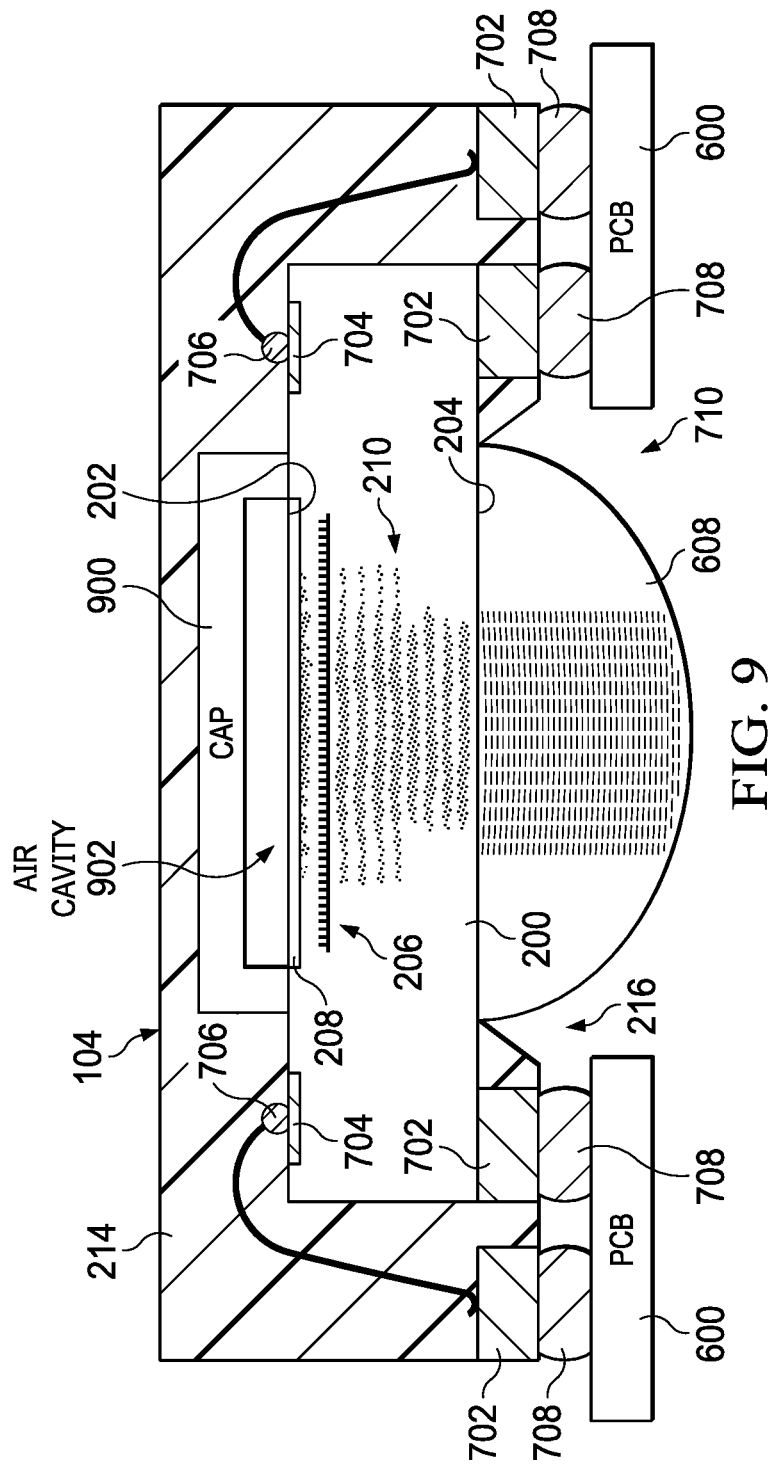
FIG. 9 is a profile cross-sectional view of a semiconductor package including an acoustic waveguide with a diffraction grating in various examples.

FIG. 9 is a profile cross-sectional view of a semiconductor package 104 including an acoustic waveguide with a diffraction grating in various examples. The example semiconductor package 104 of FIG. 9 is identical to that of FIG. 8, except that the semiconductor package 104 includes a cap 900 (e.g., a silicon cap or a cap composed of any other suitable material) and an air cavity 902 in lieu of the glob top 800. The cap 900 is coupled to the active surface 202 using any suitable form of die attach material. The presence of the cap 900 causes the air cavity 902 to be formed responsive to the mold compound 214 being applied. Acoustic waves will not propagate through the air cavity 902. Thus, the cap 900 and the air cavity 902 prevent acoustic waves radiated by the diffraction grating of the acoustic waveguide 206 from propagating through the mold compound 214. Rather, the acoustic waves propagate toward the cavity 216 and orifice 710. In examples, the cap 900 has a vertical dimension that is sufficiently large for proper mechanical handling, but that is not so large as to unduly increase package size and/or costs. Accordingly, in some examples, the cap 900 has a vertical dimension ranging from 100 microns to 300 microns. In some examples, the air cavity 902 has a vertical dimension ranging from 5 microns to 250 microns, with smaller vertical dimensions resulting in tight tolerances for adhesive thickness (e.g., the thickness of the adhesive used to couple the cap 900 to the semiconductor die 200), and larger vertical dimensions resulting in excessively large package size and/or costs. The bottom-up and perspective views of FIGS. 7B and 7C are also bottom-up and perspective views, respectively, of the structure in FIG. 9.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A package, comprising:
   a semiconductor die having a first surface and a second surface opposing the first surface, the semiconductor die including circuitry formed in the first surface;
   an acoustic waveguide in the semiconductor die, the acoustic waveguide including an array of capacitors, the array of capacitors including a transducer portion and a diffraction grating portion, the transducer portion configured to convert signals between electrical signals and acoustic waves, the diffraction grating portion configured to direct the acoustic waves toward and receive the acoustic waves from the second surface; and
   a connector coupling the circuitry to the acoustic waveguide.

2. The package of claim 1, wherein the package includes a mold compound covering the semiconductor die, the mold compound including a cavity through which the second surface is exposed to an environment of the package.

3. The package of claim 2, further comprising a glob top layer abutting the first surface, the mold compound around the glob top layer.

4. The package of claim 1, wherein the transducer portion has a first row of capacitors and a second row of capacitors, capacitors in the first row of capacitors having a first size, capacitors in the second row of capacitors having a second size, the second size different than the first size.

5. The package of claim 1, wherein the package is a quad flat no lead (QFN) package adapted to be coupled to a printed circuit board (PCB), the package including multiple conductive terminals adapted to be coupled to the PCB, the second surface facing the multiple conductive terminals.

6. The package of claim 5, wherein the diffraction grating portion is configured to direct the acoustic waves through the second surface and through an orifice in the PCB.

7. The package of claim 6, further comprising a semiconductor cap coupled to the first surface and an air cavity between a surface of the semiconductor cap and the first surface.

8. A package, comprising:
   a semiconductor die; and
   an acoustic waveguide including an array of capacitors in the semiconductor die, the array of capacitors including:
     a first portion comprising a two-dimensional array of first capacitors, the first capacitors having a first size;
     a second portion adjacent the first portion, the second portion comprising a two-dimensional array of second capacitors, the second capacitors having a second size, the second size smaller than the first size; and
     a third portion adjacent the second portion, the third portion comprising a first row of third capacitors and a second row of fourth capacitor, the third capacitors having a third size, fourth capacitors having a fourth size, the fourth size different than the third size.

9. The package of claim 8, wherein the first portion is configured to reflect acoustic waves propagating through the acoustic waveguide.

10. The package of claim 8, wherein second portion is configured to conduct acoustic waves propagating through the acoustic waveguide.

11. The package of claim 8, wherein the third portion is configured to direct acoustic waves propagating horizontally through the acoustic waveguide in a vertical direction.

12. The package of claim 8, wherein the array of capacitors includes a fourth portion comprising capacitors having a fifth size smaller than the second size.

13. The package of claim 8, wherein capacitors in the first, second, and third portions of capacitors includes first and second metal contacts, the first metal contact coupled to circuitry configured to drive the capacitor, the second metal contact coupled to first and second metal layers of the package.

14. The package of claim 8, further comprising a mold compound covering the semiconductor die, the mold compound including a cavity through which a surface of the semiconductor die is exposed to an environment of the package, and wherein the second portion is configured to produce acoustic waves and the third portion is configured to direct the acoustic waves toward the surface of the semiconductor die and through the cavity.

15. The package of claim 8, wherein the first portion of the waveguide, the second portion of the waveguide, and the third portion of the waveguide are in a plane.

16. A semiconductor package comprising:
   a semiconductor die having a first surface and a second surface opposing the first surface;
   an acoustic waveguide in the semiconductor die, the acoustic waveguide including an array of capacitors, the array of capacitors including a transducer portion and a diffraction grating portion, the transducer portion configured to produce first acoustic waves based on receiving first electrical signals and to produce second electrical signals based on receiving second acoustic waves, the diffraction grating portion configured to direct the first acoustic waves toward the second surface and to receive the second acoustic waves from the second surface; and a mold compound over the first surface of the semiconductor die and a portion of the second surface, a cavity in the mold compound exposing a portion of the second surface.

17. The semiconductor package of claim 16, wherein the diffraction grating portion is configured to direct the first acoustic waves toward the cavity and receive the second acoustic waves from the cavity.

18. The semiconductor package of claim 16, wherein the acoustic waveguide further comprises a reflector portion configured to reflect the acoustic waves, and wherein the transducer portion is between the reflector portion and the diffraction grating portion.

19. The semiconductor package of claim 16, further comprising a printed circuit board (PCB), the semiconductor package coupled to the PCB with the second surface facing the PCB.

20. The semiconductor package of claim 19, wherein the diffraction grating portion is configured to direct the first acoustic waves toward an orifice the PCB and to receive the second acoustic waves from the orifice in the PCB.

\* \* \* \* \*